United States Patent
Onoda

[19]

[11] Patent Number: 5,905,307
[45] Date of Patent: *May 18, 1999

[54] SEMICONDUCTOR DEVICE INCORPORATING MULTILAYER WIRING STRUCTURE

[75] Inventor: Hiroshi Onoda, Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/639,440

[22] Filed: Apr. 29, 1996

[30] Foreign Application Priority Data

May 1, 1995 [JP] Japan ................................ 7-107177

[51] Int. Cl.$^6$ ................................................ H01L 23/535
[52] U.S. Cl. ........................ 257/775; 257/758; 257/776
[58] Field of Search ................................ 257/773, 774, 257/775, 776, 758; 438/638, 640, 637

[56] References Cited

U.S. PATENT DOCUMENTS

| | | | |
|---|---|---|---|
| 4,342,045 | 7/1982 | Kim | 257/774 |
| 4,916,521 | 4/1990 | Yoshikawa et al. | 257/774 |
| 4,924,289 | 5/1990 | Matsuoka | 257/776 |
| 4,924,290 | 5/1990 | Enkaku et al. | 257/758 |
| 4,943,539 | 7/1990 | Wilson et al. | 438/637 |
| 4,951,101 | 8/1990 | Alter et al. | 257/774 |
| 5,208,658 | 5/1993 | Murata | 257/758 |
| 5,243,222 | 9/1993 | Harper et al. | 257/774 |
| 5,442,236 | 8/1995 | Fukazawa | 257/774 |
| 5,504,375 | 4/1996 | Carlson et al. | 257/774 |
| 5,561,327 | 10/1996 | Jun | 257/774 |
| 5,614,765 | 3/1997 | Avanzino et al. | 257/774 |
| 5,691,566 | 11/1997 | Sturdivant | 257/775 |
| 5,691,572 | 11/1997 | Chung | 257/776 |

FOREIGN PATENT DOCUMENTS

| | | | |
|---|---|---|---|
| 59-094865 | 5/1984 | Japan | 257/774 |
| 60-081841 | 5/1985 | Japan | 257/774 |
| 61-272957 | 12/1986 | Japan | 257/774 |
| 4-152561 | 5/1992 | Japan | 257/758 |
| 4-207053 | 7/1992 | Japan | 257/758 |
| 6-097293 | 4/1994 | Japan | 257/774 |

*Primary Examiner*—David B. Hardy
*Attorney, Agent, or Firm*—Rabin & Champagne, P.C.

[57] ABSTRACT

In a semiconductor device having multilayer wiring, upper metallization layers and elements or lower metallization layers are eletrically connected via embedded metals in contact holes or through holes. A diameter of each of the embedded metals is set larger than a width of each of the upper metallization layers, the lower metallization layers and/or terminals of the elements.

6 Claims, 9 Drawing Sheets

SEMICONDUCTOR DEVICE INCORPORATING MULTILAYER WIRING STRUCTURE

REFERENCE TO RELATED APPLICATION

This application claims the priority right under 35 U.S.C. §119, of Japanese Patent Application No. Hei 07-107177 filed on May 1, 1995, the entire disclosure of which is incorporated here by reference.

BACKGROUND OF THE INVENTION

1. Field of the Invention

The present invention relates to a semiconductor device, and more particularly, to a wiring or interconnection structure of the semiconductor device.

2. Description of the Prior Art

FIG. 1 and FIG. 2 are sectional views of a conventional semiconductor device. In FIG. 1, metallic upper wiring layers 105 are depicted to be perpendicular to the figure space. In FIG. 2, metallic lower wiring layers 102 are depicted to be perpendicular to the figure space.

According to the prior art, as shown in FIG. 1 and FIG. 2, contact holes or through holes are connected to adjacent wiring layers so that multilayer interconnections of the semiconductor device are constructed. Then it is required that wiring layers are set thick to leave margins in matching by lithography where the contact or through holes are connected to the wiring layers.

In FIG. 1 and FIG. 2, a numeral 101 represents a substrate structure including wiring layers or elements, a numeral 102 metallic lower wiring layers or a structure including elements, a numeral 103 an inter-layer insulating film, a numeral 104 contact holes or through holes (the contact holes are used when the ground layer includes elements whereas the through holes are used when the ground layer includes metallic wiring), a numeral 105 metallic upper wiring layers, and a numeral 106 an inter-layer insulating film or a passivation film.

FIG. 3 shows positioning of the contact or through holes 104 and each wiring layer.

As shown in FIG. 4, recent semiconductor devices are provided with a high density wiring structure called a borderless structure in which the diameter of each of the contact or through holes 204 is set equal to a width of the metallic lower (or upper) wiring layer 202.

However, as shown in FIG. 1, the wiring layers are set larger in width at the contact areas with the contact or through holes to leave margins in matching by the photolithography. Accordingly, a pitch between the wiring layers is essentially decided by an interval between the wiring layers at the contact areas of the contact or through holes and the upper or lower layers. The width of the wiring layers is decided not only by design rules but also by an efficiency of steppers and flatness of a device accomplished by the photolithography, etc. As for a conventional device, there is left a margin of 0.2 to 0.3 micron on one side of each wiring layer. It is implied that a width of each wiring layer as broadened by 0.4 to 1.0 micron on both sides. Accordingly, the device is highly integrated, and requires a superficial width of the wiring layers broadened by the above values as compared to an actual width of the wiring layers, which causes an obstacle to realize a high density.

In more detail, as shown in FIG. 5, when the contact or through holes 304 are arrayed to be aligned with each other in a single line margins in matching the contact or through holes 304 and each layer decide the minimum interval between the wiring layers. Realization of high density requires, as shown In FIG. 6, that the contact or through holes 308 connected to adjacent wiring layers 306 should be arrayed alternately without being aligned in a single line with each other, which restricts a layout of the contact or through holes 308 connected to adjacent wiring layers 306. Furthermore, as shown in FIG. 6, a high density can not be realized, because a pitch between the wiring layers requires at least a margin in matching on one side of each wiring layer.

As shown in FIG. 4, it is possible to realize a high density of the wiring pitch without leaving margins in matching by the photolithography, when the borderless structure, instead of the margin, is employed and a diameter of each contact or through hole is set equal to a width of each wiring layer. In practical manufacturing, when a misalignment of masks in the photolithography occurs, contact areas of the contact or through holes and the wiring layers decrease, which reduces the reliability of wire-connections, that is, allowable current density. In conclusion, there is a disadvantage not to sufficiently realize a high density structure without deciding a pitch between the wiring layers taking into account the misalignment of masks.

SUMMARY OF THE INVENTION

It is an object of the present invention to provide a semiconductor device and a method for manufacturing the same, enabling to minimize reduction of contact areas of contact holes or through holes wiring layers, even when the misalignment of masks in photolithography occurs, thereby realizing a high density of wirings.

According to one aspect of the present invention, a semiconductor device incorporating a multilayer wiring structure therein, the multilayer wiring structure electrically connecting an upper metallization layer with a lower metallization layer through contact holes or through holes formed in an inter-layer insulting film between the upper and lower wiring layers, is characterized in that each of diameters of the contact holes or the through holes is set larger than a width of the upper wiring layer.

According to another aspect of the present invention, a semiconductor device incorporating a multilayer wiring structure therein, the multilayer wiring structure electrically connecting an upper metallization layer with a lower metallization layer through contact holes or through holes formed in an inter-layer insulting film between the upper and lower wiring layers, is characterized in that each of diameters of the contact holes or the through holes is set larger than a width of the lower wiring layer.

According to another aspect of the present invention, a semiconductor device incorporating a multilayer wiring structure therein, the multilayer wiring structure electrically connecting an upper metallization layer with a lower metallization layer through contact holes or through holes formed in inter-layer insulting film between the upper and lower metallization layers, characterized in that each of contact portions of at least one of the upper metallization layer and the lower metallization layer, for connection to the contact holes or the through holes, has a width which is no more than a diameter of the contact hole or the through hole but larger than a width of other portions of the foregoing at least one of the upper metallization layer and the lower metallization layer.

According to another aspect of the present invention a method of manufacturing a semiconductor device having multilayer wiring, comprises the steps of forming elements or a lower metallization layer; forming an inter-layer insulating film; forming relatively thick contact holes or through holes in the inter-layer insulating film for connection to the elements or the lower metallization layer; embedding metals into the contact holes or the through holes; and forming an upper metallization layer for connection to the embedded metals, the upper wiring layer having a width which is smaller than a diameter of each embedded metal.

According to another aspect of the present invention, a method of manufacturing a semiconductor device having multilayer wiring, comprises the steps of forming elements or a lower metallization layer; forming an inter-layer insulating film; forming relatively trick contact holes or through holes in the inter-layer insulating film for connection to the elements or the lower metallization layer; embedding metals into the contact holes or the through holes; forming an upper metallization layer for connection to the embedded metals, the upper wiring layer having a width which is smaller than a diameter of each embedded metal; and repeating the steps (b) to (e) over the upper metallization layer.

According to another aspect of the present invention, a method of manufacturing a semiconductor device having multilayer wiring, comprises the steps of forming elements or a lower metallization layer; forming an inter-layer insulating film; forming contact holes or through holes in the inter-layer insulating film, each of the contact holes or the through holes having a diameter which is larger than a width of each of terminals of the elements or a width of the lower metallization layer; embedding metals into the contact holes or the through holes; and forming an upper metallization layer for connection to the embedded metals.

According to another aspect of the present invention, a method of manufacturing a semiconductor device having multilayer wiring, comprises the steps of forming elements or a lower metallization layer; forming an inter-layer insulting film; forming contact holes or through holes in the inter-layer insulating film each of the contact holes or the through holes having a diameter which is larger than a width of each of terminals of the elements or a width of the lower metallization layer; embedding metals into the contact holes or the through holes; forming an upper metallization layer for connection to the embedded metals; and repeating the steps (b) to (e) over the upper metallization layer.

According to another aspect of the present invention, a method of manufacturing a semiconductor device having multilayer wiring, comprises the steps of forming elements or a lower metallization layer having an increased width only at contact portions with embedded metals provided in contact holes or through holes; forming an inter-layer insulating film; forming the contact holes or the through holes in the inter-layer insulating film; providing the embedded metals in the contact holes or the through holes; and forming an upper metallization layer having an increased width only at contact portions with the embedded metals According to another aspect of the present invention, a method of manufacturing a semiconductor device having multilayer wiring, comprises the steps of forming elements or a lower metallization layer having an increased width only at contact portions with embedded metals provided in contact holes or through holes; forming an inter-layer insulating film; forming the contact holes or the through holes in the inter-layer insulating film; providing the embedded metals in the contact holes or the through holes; forming an upper metallization layer having an increased width only at contact portions with the embedded metals; and repeating the steps (b) to (e) over the upper metallization layer.

BRIEF DESCRIPTION OF THE DRAWINGS

The invention will be more fully understood by reading the subsequent detailed description of the preferred embodiments thereof with reference to the accompanying drawings, wherein.

DESCRIPTION OF THE PREFERRED EMBODIMENT

Now, preferred embodiments of the present invention will be described hereinbelow with reference to the accompanying drawings.

Figure 1:
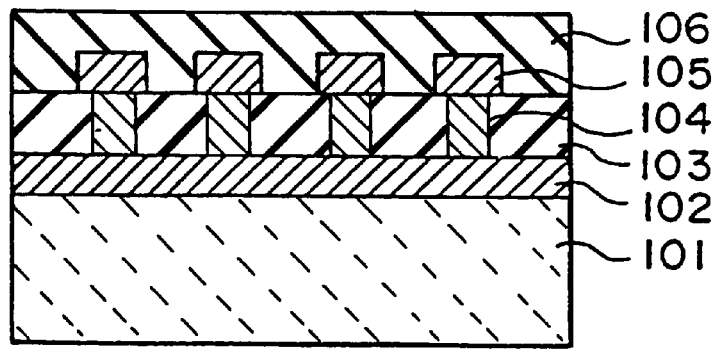
FIG. 1 is a sectional view illustrating a conventional semiconductor device.
Figure 2:
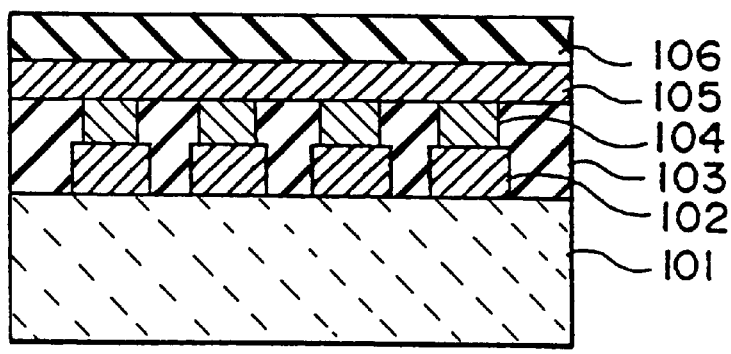
FIG. 2 is a sectional view illustrating another conventional semiconductor device.
Figure 3:
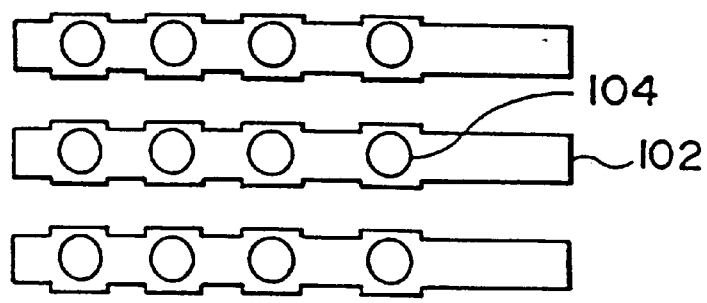
FIG. 3 is a plan view illustrating a conventional semiconductor device.
Figure 4:
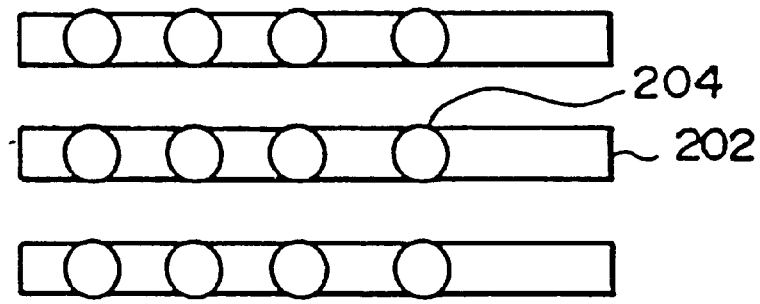
FIG. 4 is a plan view illustrating borderless wiring layers of a conventional semiconductor device.
Figure 5:
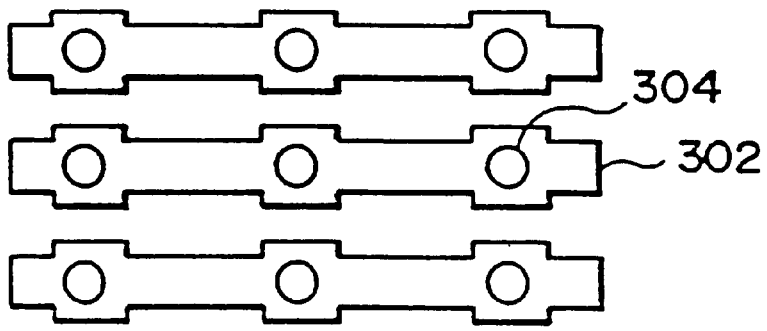
FIG. 5 is a plan view illustrating contact holes or through holes, arrayed to be aligned in a single line with each other, of a conventional semiconductor device.
Figure 6:
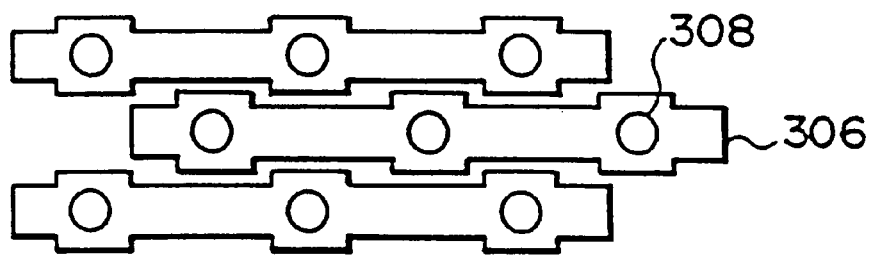
FIG. 6 is a plan view illustrating contact holes or through holes, alternately arrayed with each other, of a conventional semiconductor device.
Figure 7:
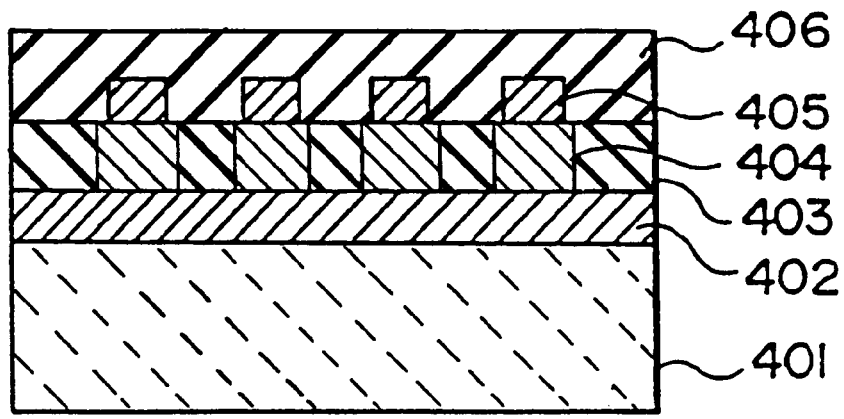
FIG. 7 is a sectional view illustrating a semiconductor device according to a first preferred embodiment of the present invention.
Figure 8:
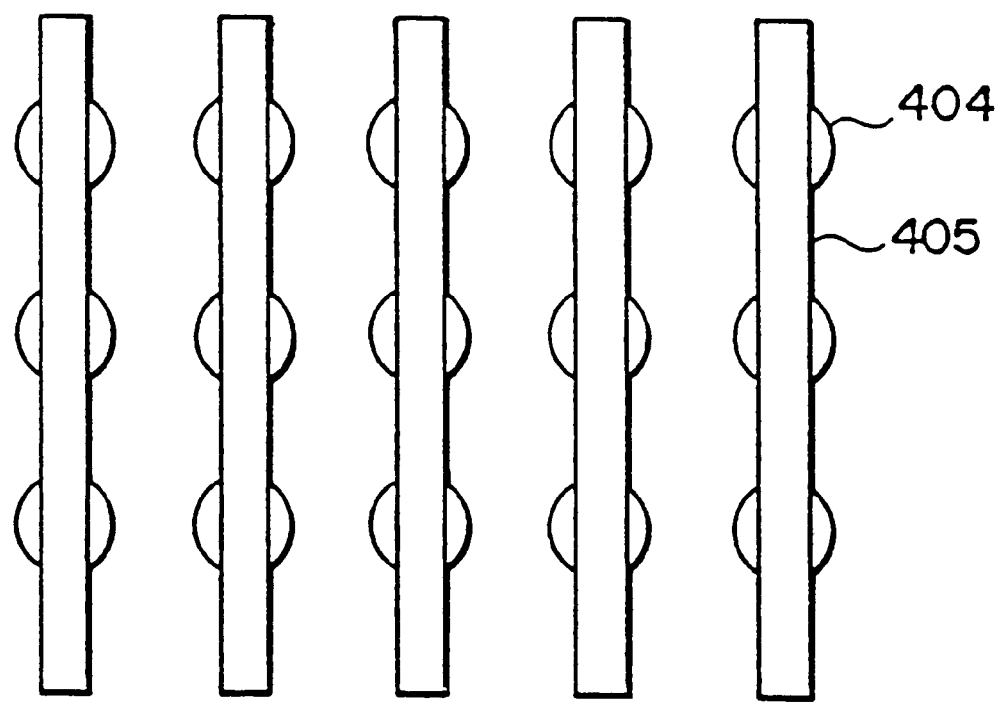
FIG. 8 is a plan view illustrating positioning relationship between upper metallization layers and through holes in the first preferred embodiment shown in FIG. 7.

FIG. 7 is a sectional view of a semiconductor device according to a first preferred embodiment of the present invention. FIG. 8 shows positioning relationship between upper metallization layers and through holes.

In FIG. 7, a numeral 401 represents a substrate structure including wiring layers or elements, a numeral 402 lower metallization layers or a structure including elements, a numeral 403 an inter-layer insulating film, a numeral 404 contact holes or through holes, a numeral 405 upper metallization layers, and a numeral 406 an inter-layer insulating film or a passivation film.

In this preferred embodiment, each of diameters of the contact or through holes 404 is set larger than each of widths of the upper metallization layers 405 depicted to be perpendicular to the figure space. As shown in FIG. 8, each of diameters of the contact or through holes 404 is set larger than any one of widths of the upper metallization layers 405. FIG. 9B shows misalignment between the contact or through holes and the upper metallization layers occurred after patterning process, wherein the upper metallization layers 505 are depicted to be perpendicular to the figure space.

Figure 9A:
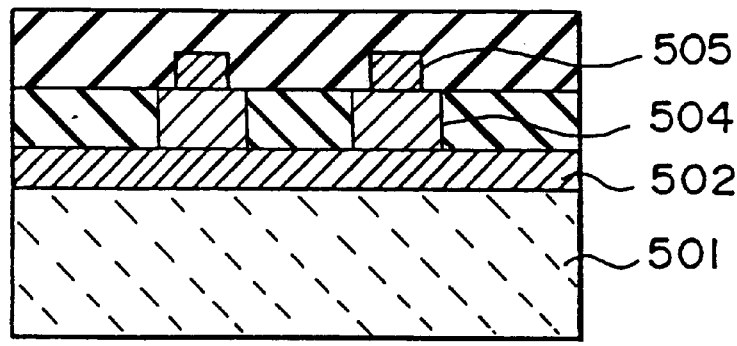
FIGS. 9A and 9B are sectional views for explaining misalignment between upper metallization layers and through holes in a process of photolithography in the first preferred embodiment shown in FIG. 7.
Figure 9B:
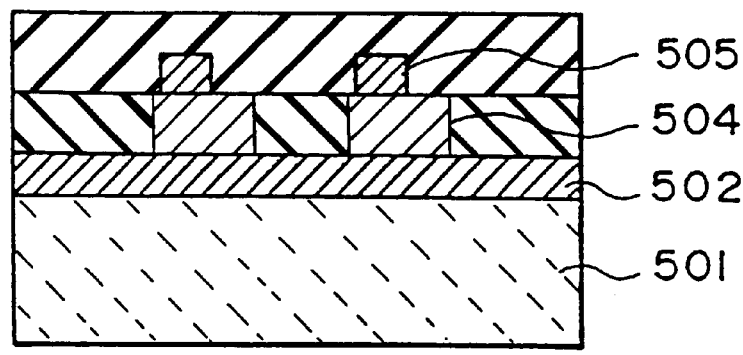

As seen from FIGS. 9A and 9B, since each of widths of the upper metallization layers 505 is set narrower than any one of diameters of the contact or through holes 504, contact areas of the contact or through holes 504 with the upper metallization layers 505 do not substantially decrease, even though there occurs the misalignment of masks. Decrease of the contact areas is small enough even if there occurs the misalignment of masks beyond one of diameters of the contact or through holes 504. A numeral 501 represents a substrate structure including wiring layers or elements, and a numeral 502 lower metallization layers or a structure including elements.

Additionally, the above metallic wiring metallization layers 402 and 405 can be realized as a multi-level wiring structure constituted of Al, alloyed Al or refractory metal, a silicide wiring layer constituted of refractory metals, like W, Ti, Co, Ni and Pd, or refractory metals, such as W, Ti, TiN, Co or the like.

The metals embedded into the above contact or through holes 404 can be Al, alloyed Al, silicide of refractory metals, such as Ti, Co, Ni, Pd or the like, or refractory metals, such as W, Ti, TiN, Co or the like.

Figure 10:
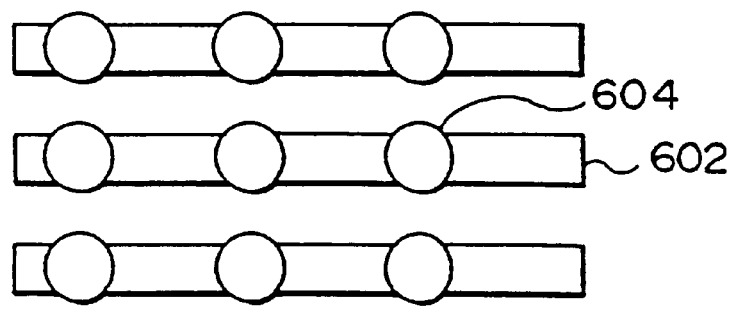
FIG. 10 is a plan view illustrating contact holes or through holes, arrayed to be aligned in a single line with each other, of a semiconductor device in the first preferred embodiment shown in FIG. 7.
Figure 11:
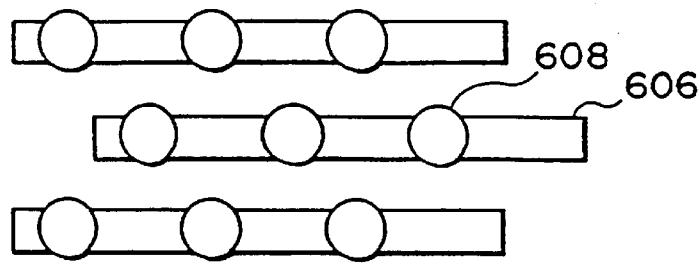
FIG. 11 is a plan view illustrating contact holes or through holes, alternately arrayed with each other, of a semiconductor device in the first preferred embodiment show in FIG. 7.

FIG. 10 is a plan view illustrating contact or through holes of a semiconductor device according to the first preferred embodiment, arrayed to be aligned with the holes facing each other. FIG. 11 is a plan view illustrating contact or through holes of a semiconductor device according to the first preferred embodiment, arrayed in such a manner that the holes in each wiring layer is alternately or interdigitally aligned with each other.

In FIG. 10, a numeral 602 represents lower metallization layers, a numeral 604 contact or through holes aligned to be faced with each other. In FIG. 11, a numeral 606 represents lower metallization layers or a structure including elements, a numeral 608 contact or through holes, alternately aligned with respect to the holes on adjacent neighboring layers.

A high density of wiring layers can be determined by a pitch between the contact or through holes in the case of FIG. 10 and a distance between the contact or through holes and the wiring layers in the case of FIG. 11. In other words, without restricted by a margin for mask alignment in a process of the photolithography, the density of the wiring layers can be maximized to the extent that the diameter of the contact or through holes or the distance between the adjacent two holes reaches to the lithography limit.

Figure 12:
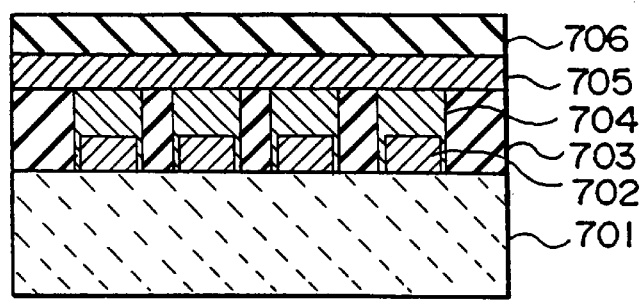
FIG. 12 is a sectional view illustrating a semiconductor device according to a second preferred embodiment of the present invention.
Figure 13:
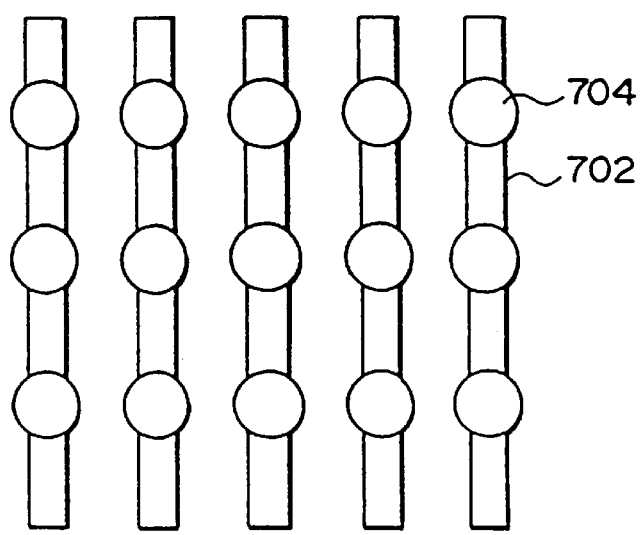
FIG. 13 is a plan view illustrating positioning relationship between lower metallization layers and through holes in the second preferred embodiment shown in FIG. 12.

FIG. 12 is a sectional view illustrating a semiconductor device in a second preferred embodiment of the present invention. FIG. 13 shows the position relationship between lower metallization layers and through holes.

In FIG. 12 a numeral 701 represents a substrate structure including wiring layers or elements, a numeral 702 lower metallization layers or a structure including elements, a numeral 703 an inter-layer insulating film, a numeral 704 through holes, a numeral 705 upper metallization layers, a numeral 706 an inter-layer insulating film or a passivation film.

In this preferred embodiment, each of diameters of the through holes 704 is set larger than any one of widths of the lower metallization layers 702 depicted to be perpendicular to the figure space.

Figure 14A:
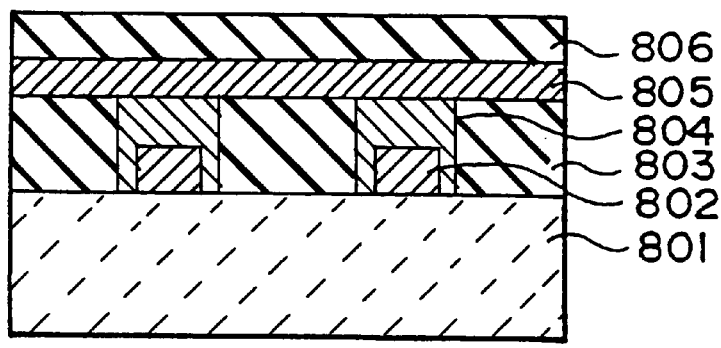
FIGS. 14A to 14C are sectional views for explaining misalignment between lower metallization layers and through holes in a process of photolithography in the second preferred embodiment show in FIG. 12.
Figure 14B:
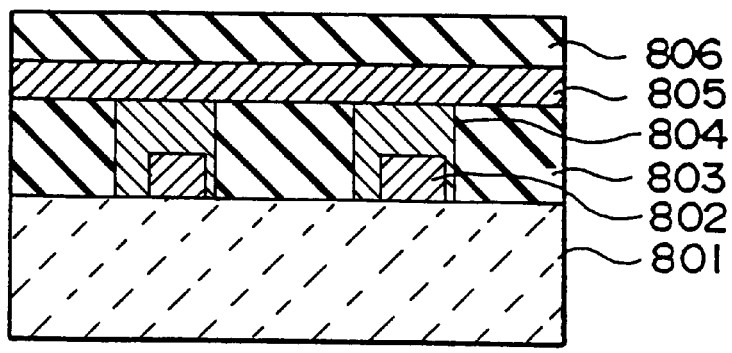
Figure 14C:
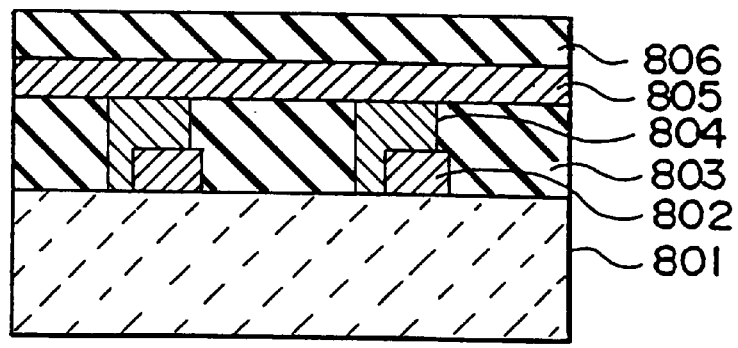

In this preferred embodiment, each of diameters of the through holes 704 is set larger than any one of widths of the lower metallization layers 702, so that positioning relationship between the through holes 704 and the lower wiring layers is as shown in FIGS. 14B and 14C, provided there occurs a misalignment between them. Namely, since each of widths of the lower metallization layers is set smaller than any one of diameters of the through holes 704, the contact areas remain unchanged or do not substantially decrease between the through holes and the lower metallization layers even if there occurs a misalignment of masks beyond the diameter of the through holes.

Referring to FIG. 14A which shows a normal positioning relationship, through holes 804 can also be connected with side walls of lower metallization layers 802, which features that contact areas between the through holes 804 and the metallic wiring layers increase and resistance of the through holes 804 decreases. Referring to FIG. 14B, since each of widths of the lower metallization layers 802 is set smaller than any one of diameters of the through holes 804, the contact areas remain unchanged even if there occurs a misalignment of masks. Referring to FIG. 14C, even if there occurs a misalignment of masks beyond any one of diameters of the through holes 804, the contact areas do not decrease substantially because the contact areas between the through holes 804 and the lower metallization layers 802 include side wall areas of the through holes 804 and the lower metallization layers 802 through which the contact can be achieved. In FIGS. 14A to 14C, a numeral 801 represents a substrate structure including wiring layers or elements, a numeral 803 an inter-layer insulating film, a numeral 805 upper metallization layers, a numeral 806 an inter-layer insulating film or a passivation film.

When the contact or through holes are provided so as to be electrically connected with diffusion layers of the elements, gate electrodes or the like, each of diameters of metals embedded into the contact or through holes is set larger than any one of widths of the corresponding terminals for the electrical connection.

Figure 15:
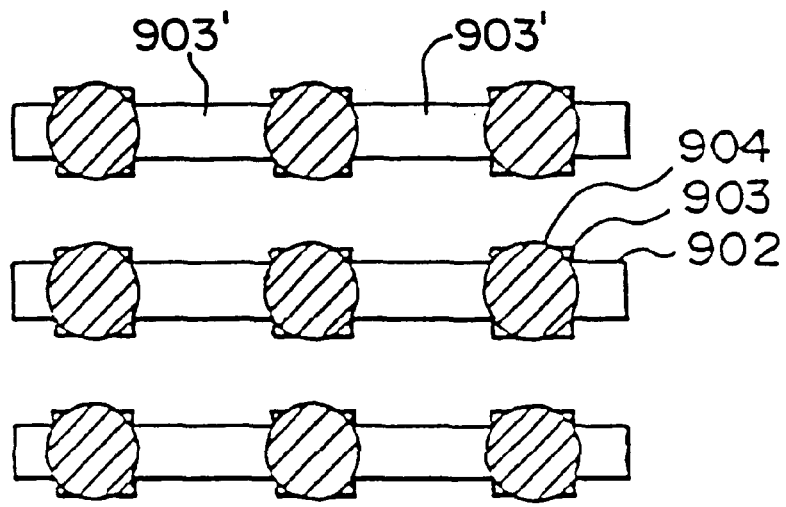
FIG. 15 is a plan view illustrating positioning relationship between contact holes or through holes and wiring layers in a third preferred embodiment of the present invention.

FIG. 15 is a plan view illustrating positioning relationship between contact or through holes and wiring metallization layers of a semiconductor device in a third preferred embodiment of the present invention.

As shown in FIG. 15, only at contact areas (portions) 903 with the contact or through holes 904, each of widths of at least one of the upper metallization layers (not shown) and the lower metallization layers 902 is set equal to or smaller than the diameter of the contact or through holes 904, but larger than any other portion 903 one of the upper metallization layers and the of the at least one of the upper metallization layers and the lower metallization layers 902.

Thus, since each of widths of at least one of the upper metallization layers and the lower metallization layers 902 is set wider, only at the contact areas 903 with the contact or through holes 904, than any other portion 903 of the at least one of the upper metallization layers and the lower metallization layers 902 within a range no more than the diameter of the contact or through holes 904, wider contact areas can be achieved between the contact or through holes 904 and the at least one of the upper metallization layers and the lower metallization layers 902. But it can not be denied that margin for misalignment of masks in this preferred embodiment is inevitably reduced as compared to either the first or second preferred embodiment.

Figure 16:
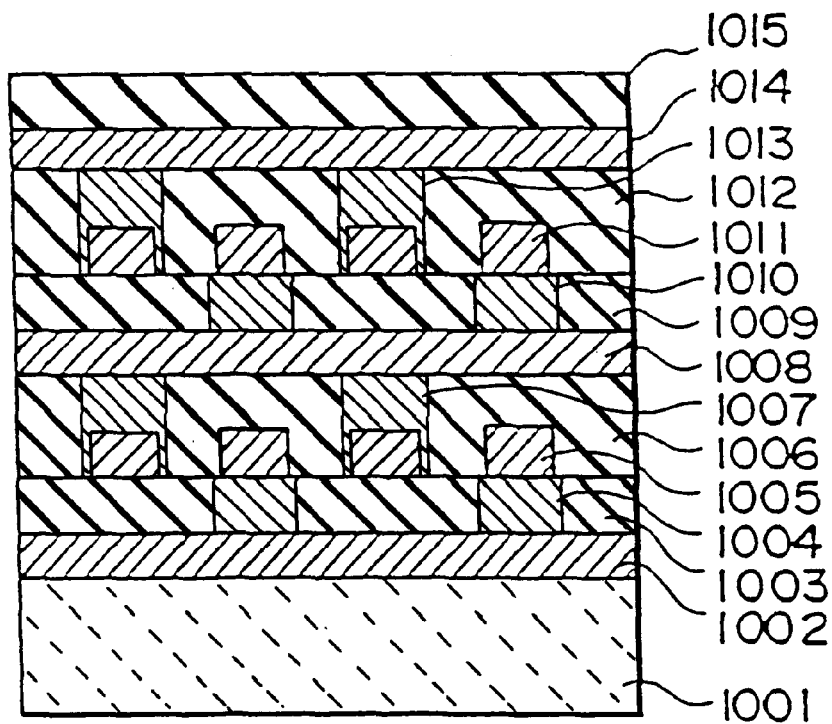
FIG. 16 is a plan view illustrating positioning relationship between contact holes or through holes and wiring layers in a fourth preferred embodiment of the present invention.

FIG. 16 is a plan view illustrating positioning relationship between contact or through holes and wiring layers of a semiconductor device in a fourth preferred embodiment of the present invention.

In FIG. 16, a numeral 1001 represents a substrate structure including wiring layers or elements, a numeral 1002 first metallic wiring layers, a numeral 1003 a first inter-layer insulating film, a numeral 1004 first through holes, a numeral 1005 second metallic wiring layers, a numeral 1006 a second inter-layer insulating film a numeral 1007 second through holes, a numeral 1008 third metallic wiring layers, a numeral 1009 a third inter-layer insulating film, a numeral 1010 third through holes a numeral 1011 fourth metallic wiring layers, a numeral 1012 a fourth inter-layer insulating film, a numeral 1013 fourth through holes, a numeral 1014 fifth metallic wiring layers, a numeral 1015 a fifth inter-layer insulating film or a fifth passivation film.

Supposing the numeral 1015 represents a passivation film, the present structure depicts a five-layer metallic structure, in which each of diameters of the contact or through holes is set larger than any one of widths of upper and lower wiring layers in the multi-level structure. Alternatively, each of widths of the wiring layers is set larger, only at each contact area with the contact or through holes, than any other portions thereof within a range no more than the diameter of the contact or through holes. Namely, the first to third embodiments are repeated.

Figure 17:
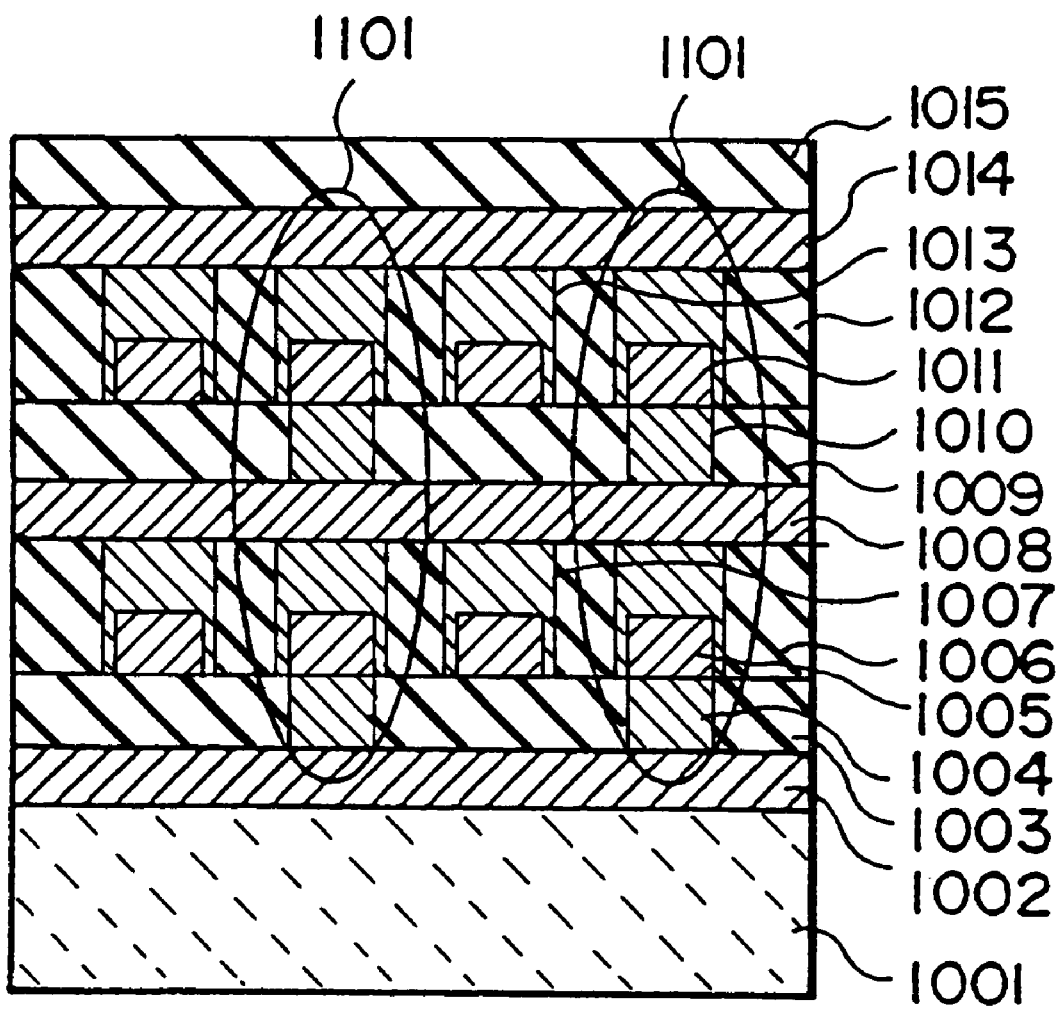
FIG. 17 is a plan view illustrating positioning relationship between contact holes or through holes and wiring layers in a fifth preferred embodiment of the present invention.

FIG. 17 is a sectional view illustrating positioning relationship between the contact or through holes and the wiring layers of a semiconductor device in a fifth preferred embodiment of the present invention. Almost the same explanation will be given to each part in FIG. 17 as given in FIG. 16.

Portions 1101 encircled by real lines are only different from the previous embodiment shown in FIG. 16; in which the same structure shown in FIG. 16 is repeatedly employed. In more detail, the present embodiment shows a stacked structure in which upper contact or through holes are provided repeatedly over lower contact or through holes.

The first to fifth preferred embodiments mainly relate to structures of a semiconductor device of the present invention, whereas a sixth preferred embodiment relates to a practical manufacturing method for accomplishing the structures set forth above. FIGS. 18A to 18D illustrate sectional views of a semiconductor device in each manufacturing step in the sixth preferred embodiment of the present invention.

Figure 18A:
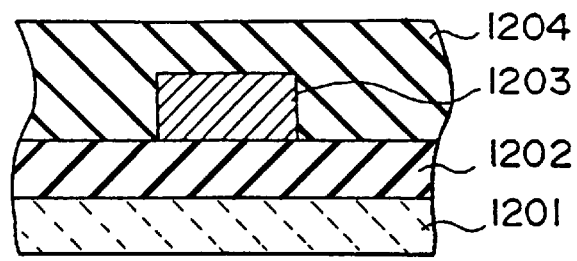
FIGS. 18A to 18D are sectional views for explaining a manufacturing process of a semiconductor device according to a sixth preferred embodiment of the present invention.

(1) Referring to FIG. 18A, an insulating film 1202 (such as a BPSG-film) is formed on an IC-substrate 1201 by employing a CVD (Chemical Vapor Deposition) method, and then an alloyed Al layer 1203 having 800 nm in thickness as a first metallic wiring layer is formed on the insulating film 1202. Many materials can be employed as of the wiring layer 1203, such as an Al wiring, an alloyed Al wiring, multi-layer wirings with refractory metals thereof, silicide wirings of refractory metals such as W, Ti, Co, Ni, Pd or the like, or wirings of refractory metals such as W, Ti, TiN, Co or the like. A sputtering method and an EB vacuum evaporation method other than the CVD method can be employed. The wiring layers are completed by photolithography and etching. In the subsequent step, an inter-layer insulating film 1204 (such as $SiO_2$) having 1 $\mu$m in thickness is formed.

Figure 18B:
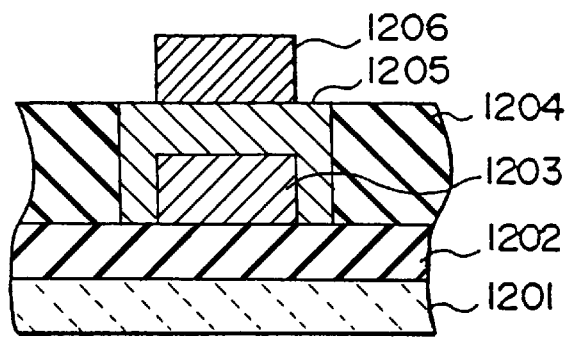

(2) Then, referring to FIG. 18B, through holes 1205 are formed so as to be connected with the first metallic wiring layer by photolithography and etching. The through holes are formed in such a manner that etching is further continued up until the insulating film 1202 is exposed after the first metallic wiring layer, the alloyed Al wiring layer 1203, is exposed. Each of diameters of the through holes 1205 is set larger than any one of widths of the first alloyed Al wiring layer 1203 (A margin of one side of each layer is about 0.1 $\mu$m to 0.5 $\mu$m). A reactive ion etching is employed under conditions given by RF power of 2 KW, $C_2F_6$ of 50 sccm, $CHF_3$ of 10 sccm and a pressure of 80 Pa.

After sputter clean by Ar, a buried metallic layer which should be connected with the alloyed Al wiring layer 1203 is embedded into the through holes 1205. Materials utilized for the buried metallic layer can be selected from a silicide of an Al, an alloyed Al, and refractory metals, such as W, Ti, Co, Ni, Pd or the like, or refractory metals, such as W, Ti, TiN, Co or the like.

In a more preferred embodiment, the embedded metallic layer employs materials different from those of the first and second metallic wiring layers on the ground that the embedded metallic layer can serve as an etching stopper in the subsequent etching step for the second metallic wiring layer formed in the later steps. In the present embodiment, a blanket W and an etch-back method are employed so that W and TiN/Ti are respectively shown as adhesive ground layers.

First, a Ti film having approximate 15 nm in thickness and a TiN film having approximate 50 nm to 100 nm in thickness are provided on the entire surface of through holes by employing either the sputtering or the CVD method. Subsequently, W is provided on the entire surface of the substrate by employing the CVD method. Then, unnecessary W is removed by the etching back in such a manner that no step difference occurs in the through holes. An alloyed Al film 1206 having 880 nm in thickness is, then, provided so as to form the second metallic layer by the photolithography and etching.

The materials utilized for the second metallic wiring layer and the method for manufacturing the second layer are the same as those of the first wiring layer. Namely, an Al wiring, an alloyed Al wiring, multi-layer wiring with its refractory metals, a silicide wiring of refractory metals, such as W, Ti, Co, Ni, Pd or refractory metals, such as W, Ti, TiN, Co can be utilized as such materials. The method for forming the second layer could be the sputtering method, the CVD method, the EB vacuum evaporation method or the like.

Figure 18C:
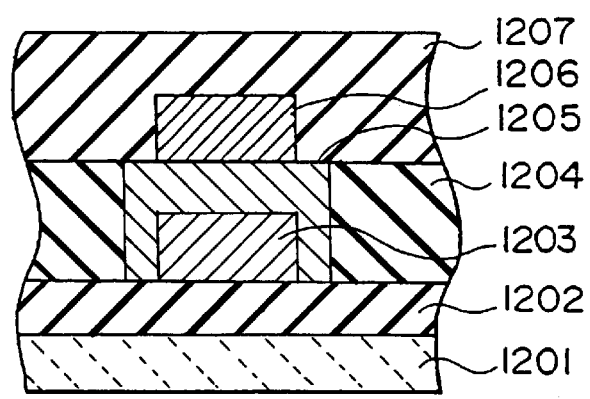

(3) In case that a further metallic wiring layer is formed on the layers constructed above, as shown in FIG. 18C, a second inter-layer insulating film 1207 having 1 $\mu$m in thickness (such as $SiO_2$) is formed by the CVD method.

Figure 18D:
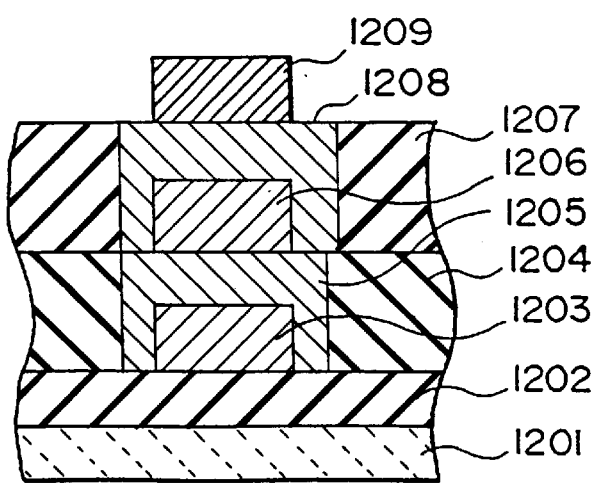

(4) Subsequently, as shown in FIG. 18D, through holes 1208 are formed into the second inter-layer insulating film 1207. In the present embodiment, connection is given not only with the second metallic wiring layers but also with the first metallic wiring layers. In more detail, the through holes 1208 are formed right over the through holes 1205 by employing the photolithography and etching, and each of diameters of the second through holes 1208 is set larger than any one of widths of the alloyed Al film 1206 which is the second metallic wiring layer.

The etching condition may be the same as that in forming the through holes 1205. After the similar treatment applied to the metallic layer embedded into the through holes 1205 is employed, W is embedded into the through holes 1208 by etching back. Finally, the third metallic wiring layer 1209 is provided and patterned. Repeating the above steps, multi-wiring layers and another through holes can be formed right over the lower through holes.

The foregoing preferred embodiments mainly deal with the through holes. However, as described before, the present invention is also applicable to the contact holes which can achieve electrical connection with diffusion layers, gate electrodes or the like of all of those elements having different levels in height.

It is not necessary to apply the present invention to all parts in the integrated circuit. Specifically, each of diameters of the contact or through holes may be set larger than a width of the wiring layers only at required parts in the circuit so as to realize the high density of the wirings.

While the present invention has been described in terms of the preferred embodiments, the invention is not to be limited thereto, but can be embodied in various ways without departing from the principle of the invention as defined in the appended claims.

As described above in detail, the following effects can be achieved in the foregoing preferred embodiments:

(1) A diameter of each of the embedded metals in the contact holes or the through holes is set larger than a width of each of the upper metallization layers. Thus, the margins in matching by the photolithography are not required as opposed to the conventional semiconductor device so that the high density of the wiring can be achieved.

(2) A diameter of each of the embedded metals in the contact holes or the through holes is set larger than a width of each of the lower metallization layers or the terminals of the elements. Thus, even if there occurs the misalignment between the contact or through holes and the wiring layers, the contact areas therebetween remain unchanged as long as the misalignment is within the width of the wiring layers. Further, even if there occurs the misalignment beyond the width of the wiring layers, the contact areas do not decrease substantially. Specifically, since the contact areas include side wall areas of the through holes and the wiring layers, the contact areas increase and thus the resistance of the through holes decreases so that the reliability in connection is enhanced.

(3) A width of each of the upper metallization layers, the elements or the lower metallization layers is increased only at the contact portions with the embedded metals in the contact or through holes within a range no more than a diameter of each embedded metal. Thus, the following effects can be achieved in addition to the foregoing effect (1):

(a) Due to increase of the contact areas between the contact or through holes and the wiring layers, the low-resistance contact or through holes can be realized. This means that the contact or through holes with high reliability can be provided.

(b) Even if there occurs the misalignment between the contact or through holes and the wiring layers, the contact areas therebetween remain unchanged as long as the misalignment is within the width of the wiring layers. Further, even if there occurs the misalignment beyond the width of the wiring layers, the contact areas are large enough to render a reduction ratio small.

(c) Since the width of the wiring layers other than the contact portions with the contact or through holes can be set small, the wiring pitch can be rendered small at portions where no contact or through holes exist, so as to achieve the high density of the wiring.

(4) The margins for the photolithography become unnecessary, and the high density can be achieved in forming the certain wiring layers.

(5) Since the whole device is designed by allowable rules, repetition of the foregoing wiring processes can provide the high density of the whole device.

(6) Since the contact areas between the through holes and the metallic wiring layers include the side wall areas of the wiring layers, the contact areas therebetween can be increased as compared with the prior art.

(7) Since the contact areas between the through holes and the metallic wiring layers include the side wall areas of the wiring layers over the multilayer wirings, the contact areas therebetween increase.

(8) The degree of freedom for positional arrangement of the through holes is improved.

(9) The degree of freedom for positional arrangement of the through holes is enhanced, which contributes not only to realization of the high density of the device, but also to development of the CAD tool for the architecture.

What is claimed is:

1. A semiconductor device, comprising:

an upper metallization layer;

a lower metallization layer; and an inter-layer insulating film between the upper and lower metallization layers, the inter-layer insulating film having spaced-apart contact holes or through holes including conductive material electrically connecting the upper and lower metallization layers, wherein at least one of the upper metallization layer and the lower metallization layer has spaced-apart contact portions for connection with the contact holes or through holes and other portions between the contact portions, the contact portions of the at least one of the upper metallization layer and the lower metallization layer having widths which are smaller than diameters of the contact holes or through holes and larger tha widths of the other portions therebetween.

2. A semiconductor device according to claim 1, wherein the contact portion of each of the upper metallization layer and the lower metallization layer has a width which is smaller than a diameter of the respective contact hole or the through hole, but larger than a width of the other respective portion of each of the upper metallization layer and the lower metallization layer.

3. A semiconductor device, comprising:

an upper metallization layer;

a lower metallization layer; and an inter-layer insulating film between the upper metallization layer and the lower metallization layer, the inter-layer insulating film having at least one contact hole or through hole including a conductive material electrically connecting the upper metallization layer and the lower metallization layer, wherein each of the upper metallization layer and the lower metallization layer has a contact portion for connection to the contact hole or through hole, and an other portion adjacent the contact portion, the contact portion of the upper metallization layer being formed on the contact hole or the through hole, and the contact portion of the lower metallization layer being formed under the contact hole or through hole, the contact portion of a least one of the upper metallization layer and the lower metallization layer having a width which is smaller than a diameter of the contact hole or the through hole, but being larger than a width of the other portion of the one of the upper metallization layer and the lower metallization layer.

4. A semiconductor device according to claim 3, wherein the contact portion of each of the upper metallization layer and the lower metallization layer has width which is smaller than a diameter of the respective contact hole or the through hole, but larger than a width of the other respective portion of each of the upper metallization layer and the lower metallization layer.

5. A semiconductor device, comprising:

a metallization layer; and an insulating film positioned adjacent to the metallization layer, and having at least one spaced-apart contact hole or through hole including conductive material electrically connecting the metallization layer, wherein the metallization layer has a contact portion for connection to the contact hole or through hole, and an other portion adjacent the contact portion, the contact portion having a width which is smaller than a diameter of the contact hole or the through hole, but larger than a width of the other portion of the metallization layer.

6. The semiconductor device of claim 5, wherein the contact portion is positioned either over or under the contact hole or the through hole.

\* \* \* \* \*